(12) United States Patent
Zou

(10) Patent No.: US 10,992,288 B2
(45) Date of Patent: Apr. 27, 2021

(54) OSCILLATOR DEVICE

(71) Applicant: TDK Corporation, Tokyo (JP)

(72) Inventor: Lei Zou, Viken (NO)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/843,624

(22) Filed: Apr. 8, 2020

(65) Prior Publication Data

US 2020/0328733 A1 Oct. 15, 2020

(30) Foreign Application Priority Data

Apr. 9, 2019 (DE) .......................... 102019109322.8

(51) Int. Cl.
| | |
|---|---|
| *H03K 3/03* | (2006.01) |
| *H03K 3/011* | (2006.01) |
| *H03K 3/0231* | (2006.01) |
| *H03K 5/134* | (2014.01) |
| *H03K 3/354* | (2006.01) |
| *H03K 5/00* | (2006.01) |

(52) U.S. Cl.
CPC .......... *H03K 3/0315* (2013.01); *H03K 3/011* (2013.01); *H03K 3/0231* (2013.01); *H03K 3/354* (2013.01); *H03K 5/134* (2014.07); *H03K 2005/00208* (2013.01); *H03K 2005/00221* (2013.01)

(58) Field of Classification Search
CPC ........ H03B 5/04; H03K 3/011; H03K 3/0315; H03K 3/0322; H03K 3/354; H03K 5/134; H03K 2005/00208; H03K 2005/00221; H03L 1/02; H03L 1/022

USPC ......................................................... 331/57
See application file for complete search history.

(56) References Cited

U.S. PATENT DOCUMENTS

| | | | |
|---|---|---|---|
| 5,108,995 A | 4/1992 | Casper | |
| 5,180,995 A * | 1/1993 | Hayashi | ................... H03B 5/04 331/176 |
| 6,052,035 A | 4/2000 | Nolan et al. | |
| 6,229,403 B1 * | 5/2001 | Sekimoto | ............... H03K 3/011 327/103 |
| 6,304,148 B1 * | 10/2001 | Nomura | ................... G11C 7/04 326/95 |
| 6,809,603 B1 * | 10/2004 | Ho | ....................... H03K 3/0315 331/175 |

(Continued)

*Primary Examiner* — Levi Gannon
(74) *Attorney, Agent, or Firm* — Slater Matsil, LLP

(57) ABSTRACT

In an embodiment an oscillator device includes a ring oscillator circuit with at least one delay stage with an output of a last delay stage fed back to an input of a first delay stage, wherein each of the delay stages is configured to receive a charging current and to provide a delay that is dependent on the charging current and at least one of the delay stages includes a metal-oxide-semiconductor field-effect transistor and a bias circuit including an output terminal coupled to an input terminal of the ring oscillator circuit, wherein the bias circuit is configured to receive a temperature-independent reference voltage and includes a current source with a main NMOS-transistor, the current source configured to provide a control current to the ring oscillator circuit which is proportional to a difference of the temperature-independent reference voltage and a gate-source voltage of the main NMOS-transistor, and wherein the gate-source voltage of the main NMOS-transistor includes a negative temperature coefficient.

20 Claims, 3 Drawing Sheets

(56) References Cited

U.S. PATENT DOCUMENTS

| | | | | |
|---|---|---|---|---|
| 7,126,431 B2* | 10/2006 | Mintchev | ............ | H03H 11/265 |
| | | | | 331/57 |
| 2006/0082419 A1* | 4/2006 | Sakaguchi | ........... | H03K 3/0315 |
| | | | | 331/57 |
| 2009/0051443 A1 | 2/2009 | Illegems et al. | | |
| 2010/0066434 A1* | 3/2010 | Liao | ........................ | G05F 3/245 |
| | | | | 327/513 |
| 2011/0156822 A1* | 6/2011 | Takano | ................... | G05F 3/242 |
| | | | | 331/57 |
| 2014/0191814 A1* | 7/2014 | Tung | ..................... | H03K 3/011 |
| | | | | 331/57 |
| 2015/0137897 A1 | 5/2015 | Sun et al. | | |
| 2015/0303928 A1* | 10/2015 | Tang | ..................... | H03L 1/022 |
| | | | | 331/66 |
| 2019/0379363 A1* | 12/2019 | Ahmed | ................. | H03K 3/011 |

* cited by examiner

OSCILLATOR DEVICE

CROSS-REFERENCE TO RELATED APPLICATIONS

This application claims priority to German Patent Application No. 102019109322.8, filed on Apr. 9, 2019, which application is hereby incorporated herein by reference.

TECHNICAL FIELD

The present invention relates to an oscillator device.

BACKGROUND

A voltage controlled oscillator (VCO) is one of the most important building blocks in analogue and digital circuits. There are many design requirements for a VCO, which are phase stability, large electrical tuning range, linearity of frequency versus control voltage, large gain factor, etc. With respect to digital or smart phones that use these circuits, low power consumption is a very important design factor.

One kind of low-power voltage controlled oscillators are current-starved oscillators. For example, a reference current of such an oscillator in CMOS-technology can be in the range of only hundreds of nano-amperes in order to generate a 1 to 10 MHz oscillation frequency. However, such current-starved oscillators comprise an oscillation frequency with a negative temperature gradient. This means that the oscillation frequency drops with rising temperature. This is due to the temperature effects of MOS transistors in delay elements of the oscillators, i.e. the mobility of the holes and electrons of the MOS transistors decreases with increasing temperature so that the transistor fully on resistance increases with increasing temperature. At present the inherent temperature dependence of the current-starved oscillators cannot be trimmed off-chip.

SUMMARY

Embodiments provide an oscillator device with an oscillation frequency that varies as little as possible with temperature.

Various embodiments provide an oscillator device which comprises a ring oscillator circuit with at least one delay stage with an output of a last delay stage fed back to an input of a first delay stage, wherein each of the delay stages is configured to receive a charging current and to provide a delay that is dependent on the charging current, wherein at least one of the delay stages comprises a metal-oxide-semiconductor field-effect transistor. The oscillator device further comprises a bias circuit with an output terminal coupled to an input terminal of the ring oscillator circuit. The bias circuit is configured to receive a temperature-independent reference voltage and comprises a current source with a main n-type metal-oxide semiconductor, NMOS, transistor. The current source is configured to provide a control current to the ring oscillator circuit which is proportional to a difference of the temperature-independent reference voltage and a gate-source voltage of the main NMOS-transistor, wherein the gate-source voltage of the main NMOS-transistor comprises a negative temperature coefficient.

The oscillator device provides a built-in automatic temperature compensation such that the oscillator is configured to provide an oscillation frequency which is temperature stable or at least approximately temperature stable. As the gate-source voltage of the main NMOS-transistor comprises a negative temperature coefficient, the control current of the bias circuit can be provided with a positive temperature coefficient, which can be used to compensate complementary to absolute temperature (CTAT) oscillation frequency drifts of the oscillator device. Thus, a temperature-stabilized oscillator device can be provided.

According to one embodiment, each of the delay stages comprises a current-starved delay element. A low-current oscillator which is configured to provide low operation current to an analogue microphone or sleep-mode current to a digital microphone, for instance a current of 1 µA, is very desirable. Such low current oscillators can be realized by oscillators with current-starved delay elements. Thus, a temperature-stabilized oscillator device with quite low operation current, for example in the range of 1 µA, can be provided. Furthermore, a wide output swing from 0 V to VDD can be directly reached at this oscillator output so that a level shifter is not needed.

According to a further embodiment, each delay stage comprises a current starving circuit coupled to the delay element, wherein the current starving circuit comprises a first and a second transistor and the first and second transistors are arranged and configured to control the charging current provided to the delay element. In particular the first and second transistors are arranged and configured to control the charging current provided to the delay element dependent on their gate voltage. Alternatively the ring oscillator circuit comprises at least one current starving circuit, which is coupled to multiple delay elements.

According to a further embodiment, the delay element comprises an inverter circuit or is an inverter circuit. This allows for a simple and cost-effective implementation of the oscillator device.

According to a further embodiment, the inverter comprises an n-type metal oxide semiconductor transistor and a p-type metal oxide semiconductor transistor coupled as the inverter.

According to a further embodiment, the bias circuit further comprises a differential amplifier configured to compare the temperature-independent reference voltage with a measurement voltage. The bias circuit further comprises a feedback transistor with a gate-drain path of the feedback transistor being arranged in a negative feedback loop of the differential amplifier. Additionally the bias circuit comprises a resistor network, wherein a drain of the feedback transistor is coupled to a first terminal of the resistor network and a drain of the main NMOS-transistor is coupled to a second terminal of the resistor network and the measurement voltage is tapped at the first terminal of the resistor network. In this way the performance of the bias circuit as a constant current source is improved.

According to a further embodiment, the resistor network consists of a single resistor. This allows a simple and cost-effective implementation of the oscillator device.

According to a further embodiment, the resistor network comprises multiple resistors and switches for adjusting the resistor value of the resistor network effective between the first terminal and the second terminal of the resistor network. This enables calibration and/or adjustment of the oscillation frequency of the oscillation device in case of process variations.

According to a further embodiment, the respective resistor of the resistor network is an un-silicided P polysilicon resistor. Resistors of this kind have a negligible temperature coefficient (normally<100 ppm/° C.).

According to a further embodiment, a transistor aspect ratio width/length of the main NMOS-transistor is adjusted such that the control current of the bias circuit comprises a desired positive temperature coefficient which is required for compensating the temperature-dependent delay drifts of the delay stages. In this way a desired proportional-to-absolute-temperature control current can be provided by setting the transistor aspect ratio width/length of the main NMOS-transistor such that the bias circuit can provide a proper control current to compensate any CTAT oscillation frequency drift, and a constant oscillation frequency over the whole temperature range can be achieved.

According to a further embodiment, the bias circuit comprises at least one further transistor branch arranged parallel to the main NMOS-transistor, wherein the at least one transistor branch comprises a further NMOS-transistor and a switch. Effective a transistor aspect ratio width/length of the main NMOS-transistor can an easily adjusted by adjusting width according to the requirements.

According to a further embodiment, the bias circuit is configured to operate the main NMOS-transistor in a strong inversion region. In this way the negative temperature coefficient of the gate-source voltage of the main NMOS-transistor can effectively be adjusted by the transistor aspect ratio width/length.

According to a further embodiment, the reference voltage is larger than the gate-source voltage.

BRIEF DESCRIPTION OF THE DRAWINGS

Exemplary embodiments of the invention are explained in the following with the aid of schematic drawings. These are as follows.

Elements of the same design and function that appear in different figures are identified by the same reference numerals.

DETAILED DESCRIPTION OF ILLUSTRATIVE EMBODIMENTS

Figure 1:
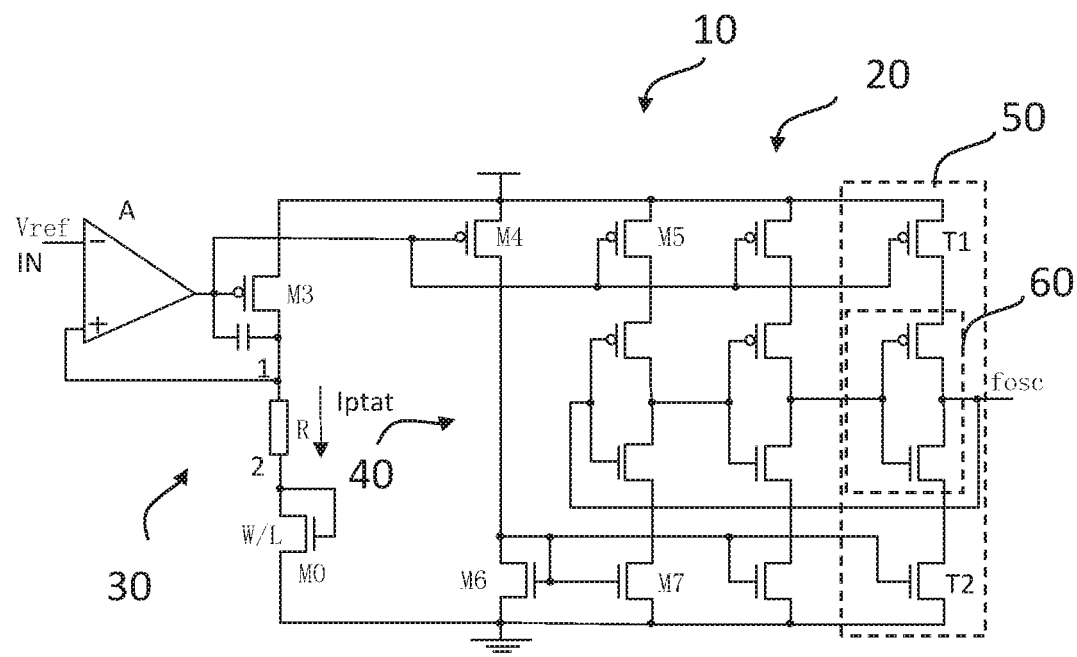
FIG. 1: a schematic diagram of an exemplary embodiment of an oscillator device.

FIG. 1 shows an exemplary embodiment of an oscillator device 10.

The oscillator device 10 comprises a ring oscillator circuit 20 and a bias circuit 30. The oscillator device 10 is for example a voltage controlled oscillator (VCO). The ring oscillator circuit 20 comprises at least one delay stage 50. In the embodiment shown in FIG. 1 the ring oscillator circuit 20 exemplarily comprises three delay stages. An output of the last delay stage is fed back to an input of the first delay stage. The at least one delay stage 50 is configured to receive a charging current and to provide a delay that is dependent on the charging current.

Preferably, each of the delay stages comprises a current-starved delay element 60 and a current starving circuit coupled to the delay element 60. For instance, the current starving circuit comprises a first transistor T1 and a second transistor T2, and the first and second transistors T1, T2 are arranged and configured to control the charging current provided to the delay element 60 dependent on their gate voltage. The delay element 60, for example, comprises an inverter circuit or is an inverter circuit, wherein an n-type metal oxide semiconductor transistor and a p-type metal oxide semiconductor transistor are coupled as the inverter.

The bias circuit 30 comprises an input terminal IN. In operation the bias circuit 30 operationally receives a temperature-independent reference voltage Vref, e. g. a bandgap reference voltage, at its input terminal IN.

The bias circuit 30 comprises, for instance, a constant-current source with a feedback transistor M3.

The constant-current source comprises a differential amplifier A, for example an operational amplifier. The differential amplifier A comprises, for instance, a negative feedback loop, wherein a gate-drain path of the feedback transistor M3 is arranged in the feedback loop. An output of the differential amplifier A is coupled to the gate of the feedback transistor M3.

The differential amplifier A acts as an error amplifier. In operation the differential amplifier A compares the temperature-independent reference voltage Vref with a measurement voltage.

Preferably the feedback transistor M3 is a PMOS-transistor.

Furthermore the bias circuit 30 comprises a main NMOS-transistor M0 and a resistor network R, wherein a drain of the feedback transistor M3 is coupled to a first terminal 1 of the resistor network R and a drain of the main NMOS-transistor M0 is coupled to a second terminal 2 of the resistor network R. The measurement voltage is tapped at the first terminal 1 of the resistor network R. A source of the main NMOS-transistor M0 is coupled with a given reference potential, in particular ground.

A capacitor is coupled to amplifier A output and the first terminal 1, which is used for frequency compensation of the negative feedback loop to enhance loop stability.

In operation the negative feedback loop forces a voltage on the first terminal 1 of the resistor network to be equal to the temperature-independent reference voltage Vref and a voltage on the second terminal 2 of the resistor network R is equal to the gate-to-source voltage Vgs of the main NMOS-transistor M0.

A control current Iptat flowing through the resistor network R can be determined according to Eq. (1)

$$Iptat=(Vref-Vgs)/Rres \qquad \text{Eq (1)}$$

wherein Vref is the temperature-independent reference voltage, Vgs is the gate-source voltage of the main NMOS-transistor M0 and Rres is the resulting resistor value of the resistor network R between the first and second terminals 1,2 of the resistor network.

The main NMOS-transistor M0 comprises a temperature-dependent gate-source voltage Vgs. The gate-source voltage Vgs comprises a negative temperature coefficient.

Figure 2:
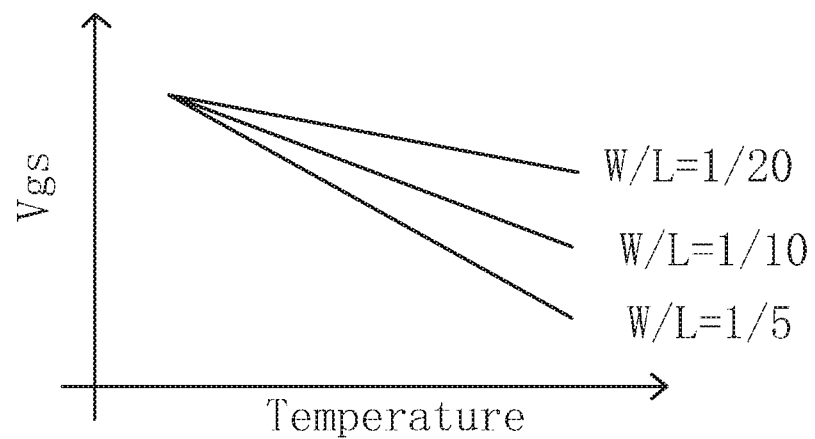
FIG. 2: a functional diagram of an exemplary gate-source voltage of an n-type metal-oxide-semiconductor transistor.

Preferably the main NMOS-transistor M0 operates in strong inversion. When an NMOS-transistor is operated in the strong inversion region, the negative temperature coefficient of the gate-source voltage Vgs can be effectively adjusted by the transistor aspect ratio width/length W/L. In FIG. 2 a varied slope of the gate-source voltage Vgs with respect to a varied transistor aspect ratio width/length W/L is shown.

Figure 3:
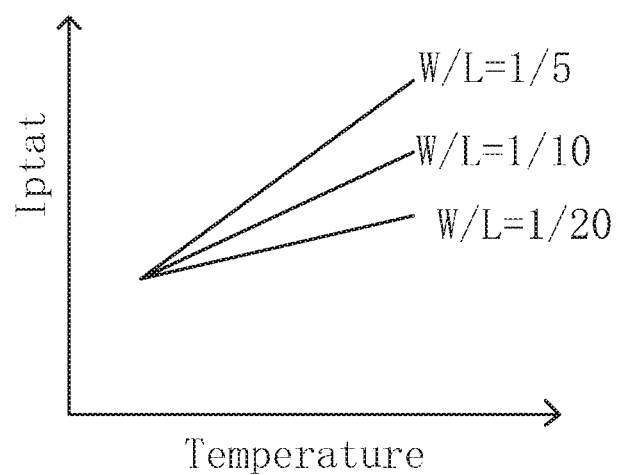
FIG. 3: a functional diagram of an exemplary control current of a bias circuit of the oscillator device.

In FIG. 3 a varied slope of the control current Iptat with respect to a varied transistor aspect ratio width/length W/L is shown.

Again, referring to Eq (1), the control current Iptat of the bias circuit 30 shows the corresponding positive temperature coefficient with varied transistor aspect ratio width/length W/L. So, no matter how large the slope of CTAT oscillation frequency fosc from the current-starved ring oscillator 20, by setting the transistor aspect ratio width/length W/L of the main NMOS-transistor M0 accordingly the CTAT oscillation frequency drift can be compensated and a constant oscillation frequency fosc over a whole temperature range, in particular from −40° C. to 120° C., can be reached.

Furthermore, the ring oscillator circuit 20 comprises, for example, a current mirror circuit 40. The current mirror circuit 40 is configured to provide the current to the at least one delay stage 50.

The current mirror circuit 40 mirrors the control current Iptat provided by the bias circuit 30 to the respective current starving circuits of the delay stages 50. For example, the control current Iptat is mirrored from a third PMOS transistor M3 to a fourth and fifth PMOS transistor M4, M5 and is then mirrored from a sixth NMOS transistor M6 to a seventh NMOS transistor M7. In this way the control current Iptat biases the first delay stage. In the same way the control current Iptat biases the second and third stages.

Figure 4:
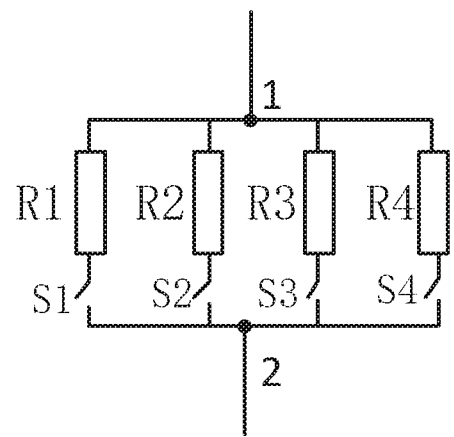
FIG. 4: a schematic diagram of a detail of an exemplary embodiment of the bias circuit.

FIG. 4 shows a detail of a further exemplary embodiment of the bias circuit 30. In this further exemplary embodiment the bias circuit 30 comprises not only one resistor but a resistor network R with multiple resistors R1, R2, R3, R4 and switches S1, S2, S3, S4 for adjusting the resistor value Rres, and related thereto the control current Iptat after production. During manufacturing the integrated circuit, for instance the ASIC, resistor process variation may occur. Such resistor process variation may cause the resulting oscillation frequency to deviate from a desired oscillation frequency. In order to calibrate the resulting oscillation frequency back to the desired oscillation frequency, the resistor value Rres of the resistor network R can be adjusted. For instance, the resistor network R comprises N, for example 3, circuit branches arranged in parallel, wherein each branch comprises a resistor R1, R2, R3, R4 and a switch S1, S2, S3, S4. The values of the respective resistors R1, R2, R3, R4 in the different branches can be equal or different. If the resulting oscillation frequency after production is higher than the desired oscillation frequency, the resistor value Rres of the resistor network R is adjusted to reduce the control current Iptat of the bias circuit 30. If the resulting oscillation frequency after production is lower than the desired oscillation frequency, the resistor value Rres of the resistor network R is adjusted to increase the control current Iptat of the bias circuit 30.

Figure 5:
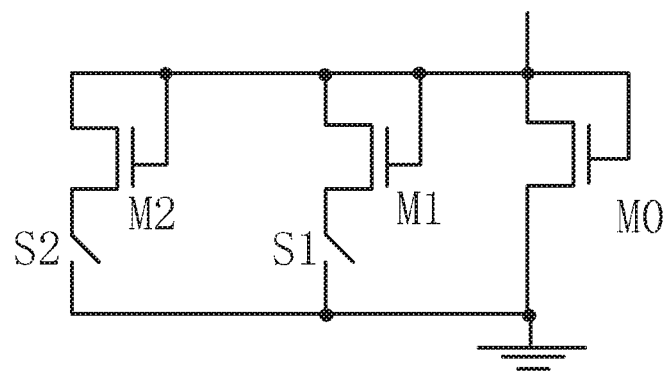
FIG. 5: a schematic diagram of a detail of a further exemplary embodiment of the bias circuit.

FIG. 5 shows a detail of a further exemplary embodiment of the bias circuit 30. In this further exemplary embodiment the bias circuit 30 comprises not only a single main NMOS-transistor M0 but an NMOS-transistor network with multiple NMOS-transistors M0, M1, M2 and multiple switches S1, S2. Each of these NMOS-transistors M0, M1, M2 can be implemented in a discrete or distributed manner.

For instance, a selective transistor network with a first NMOS-transistor M1 and a second NMOS-transistor M2 is implemented in parallel to the main NMOS-transistor M0. As shown in FIG. 5, the first and second NMOS-transistors M1, M2 are each controlled by the switches S1, S2. This enables tuning the effective W/L of the main NMOS-transistor M0 after manufacturing. If a larger positive temperature coefficient of control current Iptat of the bias circuit 30 is required, a first switch S1 can be closed, so that M1 is connected in parallel to M0, and a resulting effective W is the sum of the width of the main NMOS-transistor M0 and the first NMOS-transistor M1. If even larger positive temperature coefficient of control current Iptat is required, the two switches S1, S2 can be closed so that the first NMOS-transistor M1 and the second NMOS-transistor M2 are connected in parallel to the main NMOS-transistor M0, and the resulting effective W is the sum of the width of the main NMOS-transistor M0, the first NMOS-transistor M1 and the second NMOS-transistor M2.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An oscillator device comprising:
    a ring oscillator circuit with at least one delay stage with an output of a last delay stage fed back to an input of a first delay stage, wherein each of the delay stages is configured to receive a charging current and to provide a delay that is dependent on the charging current and at least one of the delay stages comprises a metal-oxide-semiconductor field-effect transistor; and
    a bias circuit comprising an output terminal coupled to an input terminal of the ring oscillator circuit,
    wherein the bias circuit is configured to receive a temperature-independent reference voltage and comprises a current source with a main NMOS-transistor, the current source configured to provide a control current to the ring oscillator circuit which is proportional to a difference of the temperature-independent reference voltage and a gate-source voltage of the main NMOS-transistor,
    wherein the gate-source voltage of the main NMOS-transistor comprises a negative temperature coefficient, and
    wherein a transistor aspect ratio width/length of the main NMOS-transistor is adjusted such that the control current of the bias circuit comprises a desired positive temperature coefficient for compensating temperature-dependent delay drifts of the delay stages.

2. The oscillator device according to claim 1, wherein each of the delay stages comprises a current-starved delay element.

3. The oscillator device according to claim 2, wherein each delay stage comprises a current starving circuit coupled to the delay element, and wherein the current starving circuit comprises a first transistor and a second transistor and the first and second transistors are arranged and configured to control the charging current provided to the delay element.

4. The oscillator device according to claim 2, wherein the delay element comprises an inverter circuit or is an inverter circuit.

5. The oscillator device according to claim 4, wherein the inverter circuit comprises an n-type metal oxide semiconductor transistor and a p-type metal oxide semiconductor transistor coupled as the inverter circuit.

6. The oscillator device according to claim 1, wherein the bias circuit further comprises:
    a differential amplifier configured to compare the temperature-independent reference voltage with a measurement voltage;
    a feedback transistor with a gate-drain path of the feedback transistor being arranged in a negative feedback loop of the differential amplifier; and
    a resistor network, wherein a drain of the feedback transistor is coupled to a first terminal of the resistor network and a drain of the main NMOS-transistor is coupled to a second terminal of the resistor network and the measurement voltage is tapped at the first terminal of the resistor network.

7. The oscillator device according to claim 6, wherein the resistor network consists of a single resistor.

8. The oscillator device according to claim 6, wherein the resistor network comprises multiple resistors and switches for adjusting a resistor value of the resistor network effective between the first terminal and the second terminal of the resistor network.

9. The oscillator device according to claim 6, wherein a respective resistor is an un-silicided P polysilicon resistor.

10. The oscillator device according to claim 1, wherein the bias circuit comprises at least one transistor branch arranged parallel to the main NMOS-transistor, and wherein the at least one transistor branch comprises a further NMOS-transistor and a switch.

11. The oscillator device according to claim 1, wherein the bias circuit is configured to operate the main NMOS-transistor in a strong inversion region.

12. The oscillator device according to claim 1, wherein the reference voltage is larger than the gate-source voltage.

13. An oscillator device comprising:
a ring oscillator circuit with at least one delay stage with an output of a last delay stage fed back to an input of a first delay stage, wherein each of the delay stages is configured to receive a charging current and to provide a delay that is dependent on the charging current and at least one of the delay stages comprises a metal-oxide-semiconductor field-effect transistor; and
a bias circuit comprising an output terminal coupled to an input terminal of the ring oscillator circuit,
wherein the bias circuit is configured to receive a temperature-independent reference voltage and comprises a current source with a main NMOS-transistor, the current source being configured to provide a control current to the ring oscillator circuit which is proportional to a difference of the temperature-independent reference voltage and a gate-source voltage of the main NMOS-transistor,
wherein the gate-source voltage of the main NMOS-transistor comprises a negative temperature coefficient,
wherein the bias circuit further comprises a differential amplifier configured to compare the temperature-independent reference voltage with a measurement voltage, a feedback transistor with a gate-drain path of the feedback transistor being arranged in a negative feedback loop of the differential amplifier, and a resistor network, and
wherein a drain of the feedback transistor is coupled to a first terminal of the resistor network and a drain of the main NMOS-transistor is coupled to a second terminal of the resistor network and the measurement voltage is tapped at the first terminal of the resistor network.

14. The oscillator device according to claim 13, wherein the bias circuit is configured to operate the main NMOS-transistor in a strong inversion region.

15. The oscillator device according to claim 13, wherein each of the delay stages comprises a current-starved delay element.

16. The oscillator device according to claim 13, wherein a respective resistor is an un-silicided P polysilicon resistor.

17. The oscillator device according to claim 13, wherein each of the delay stages comprises a current-starved delay element, wherein each delay stage comprises a current starving circuit coupled to the delay element, and wherein the current starving circuit comprises a first transistor and a second transistor and the first and second transistors are configured to control the charging current provided to the delay element.

18. The oscillator device according to claim 13, wherein the resistor network consists of a single resistor.

19. The oscillator device according to claim 13, wherein the resistor network comprises multiple resistors and switches for adjusting a resistor value of the resistor network effective between the first terminal and the second terminal of the resistor network.

20. An oscillator device comprising:
a ring oscillator circuit with at least one delay stage with an output of a last delay stage fed back to an input of a first delay stage, wherein each of the delay stages is configured to receive a charging current and to provide a delay that is dependent on the charging current and at least one of the delay stages comprises a metal-oxide-semiconductor field-effect transistor; and
a bias circuit comprising an output terminal coupled to an input terminal of the ring oscillator circuit,
wherein the bias circuit is configured to receive a temperature-independent reference voltage and comprises a current source with a main NMOS-transistor, the current source configured to provide a control current to the ring oscillator circuit which is proportional to a difference of the temperature-independent reference voltage and a gate-source voltage of the main NMOS-transistor,
wherein the gate-source voltage of the main NMOS-transistor comprises a negative temperature coefficient, and
wherein the reference voltage is larger than the gate-source voltage.

* * * * *